(12) United States Patent
Kim et al.

(10) Patent No.: US 9,559,126 B2
(45) Date of Patent: Jan. 31, 2017

(54) ARRAY SUBSTRATE AND DISPLAY DEVICE

(71) Applicant: BOE TECHNOLOGY GROUP CO., LTD., Beijing (CN)

(72) Inventors: Ki Man Kim, Beijing (CN); Jaegeon You, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/420,764

(22) PCT Filed: Apr. 29, 2014

(86) PCT No.: PCT/CN2014/076460
§ 371 (c)(1),
(2) Date: Feb. 10, 2015

(87) PCT Pub. No.: WO2015/100893
PCT Pub. Date: Jul. 9, 2015

(65) Prior Publication Data
US 2016/0056176 A1    Feb. 25, 2016

(30) Foreign Application Priority Data

Dec. 31, 2013   (CN) .......................... 2013 1 0752975

(51) Int. Cl.
*H01L 27/12*     (2006.01)
*G02F 1/1343*    (2006.01)
*G02F 1/1335*    (2006.01)

(52) U.S. Cl.
CPC ....... *H01L 27/124* (2013.01); *G02F 1/134363* (2013.01); *G02F 2001/133548* (2013.01); *G02F 2001/134372* (2013.01)

(58) Field of Classification Search
CPC .... H01L 27/1463; H01L 28/65; H01L 51/102; H01L 21/048; H01L 23/53219; H01L 23/4951; H01L 23/4952; H01L 27/1251; H01L 29/4908; H01L 27/124; H01L 51/0508

(Continued)

(56) References Cited

U.S. PATENT DOCUMENTS 7,130,003 B2 * 10/2006 Park .................... G02F 1/13458
349/54
7,829,896 B2 * 11/2010 Wang ..................... H01L 27/12
257/72

(Continued)

FOREIGN PATENT DOCUMENTS

CN          1963645 A      5/2007
CN          101193481 A    6/2008

(Continued)

OTHER PUBLICATIONS

First Chinese Office Action issued Mar. 31, 2015; Appln. No. 201310752975.5.

(Continued)

*Primary Examiner* — David Nhu
(74) *Attorney, Agent, or Firm* — Ladas & Parry LLP

(57) ABSTRACT

An array substrate and a display including the array substrate, the array substrate includes a substrate (1); a pixel structural layer formed on the substrate (1); and a wiregrid layer (6) located between the substrate (1) and the pixel structural layer. The wiregrid layer (6) includes a plurality of light blocking bars (4) arranged in parallel. With the wiregrid layer (6) formed of light blocking bars (4), an occurrence of light leak due to a stress generated by the substrate (1) can be avoided.

17 Claims, 2 Drawing Sheets

Figure 1:
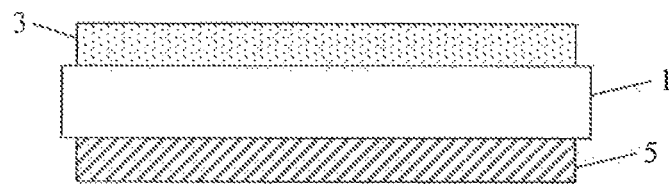

(58) Field of Classification Search
USPC .............. 257/387, 431, 670, 678, 765, 771, 257/E21.006, E21.045, E21.061, E23.069, 257/E23.126
See application file for complete search history.

(56) References Cited

U.S. PATENT DOCUMENTS

| | | | | |
|---|---|---|---|---|
| 9,041,883 | B2* | 5/2015 | Minato | .................. G02B 5/201 349/110 |
| 9,229,267 | B2* | 1/2016 | Hong | ................ G02F 1/133526 |
| 2008/0123008 | A1 | 5/2008 | Yoshii | |
| 2009/0109384 | A1 | 4/2009 | Kim et al. | |
| 2009/0225259 | A1 | 9/2009 | Choi | |
| 2013/0002974 | A1 | 1/2013 | Minato et al. | |
| 2013/0265516 | A1 | 10/2013 | Chen | |
| 2013/0278847 | A1 | 10/2013 | Hong et al. | |
| 2015/0109666 | A1* | 4/2015 | Wei | ........................ G02B 27/26 359/462 |

FOREIGN PATENT DOCUMENTS

| | | |
|---|---|---|
| CN | 101425520 A | 5/2009 |
| CN | 101526708 A | 9/2009 |
| CN | 201984265 U | 9/2011 |
| CN | 103176317 A | 6/2013 |
| CN | 203084389 U | 7/2013 |
| CN | 2034084389 A | 7/2013 |
| CN | 103293811 A | 9/2013 |
| CN | 103365013 A | 10/2013 |
| CN | 103424925 A | 12/2013 |
| CN | 103454807 A | 12/2013 |
| CN | 103680328 A | 3/2014 |
| CN | 103760707 A | 4/2014 |
| JP | 2005-283870 A | 10/2005 |

OTHER PUBLICATIONS

Chinese Notice of Allowance issued Jul. 29, 2015; Appln. No. 201310752975.5.

International Search Report Appln. No. PCT/CN2014/076460; Dated Sep. 18, 2014.

Written Opinion of the International Searching Authority Appln. No. PCT/CN2014/076460; Dated Sep. 18, 2014.

First Chinese Office Action Appln. No. 201310752975.5; Dated Mar. 31, 2015.

* cited by examiner

ARRAY SUBSTRATE AND DISPLAY DEVICE

The present application is a 371 of PCT/CN2014/676460 filed on Apr. 29, 2014, and claims benefits and priority of Chinese patent application No. 201310752975.5 filed on Dec. 31, 2013, titled "ARRAY SUBSTRATE AND DISPLAY DEVICE", the entire contents of which are incorporated herein by reference.

TECHNICAL FIELD

Embodiments of the present invention relate to an array substrate and a display device.

BACKGROUND

FIG. 1 illustrates an array substrate of ADvanced Super Dimension Switch (ADS) mode. The array substrate comprises a substrate 1, a pixel structural layer (only a common electrode 3 at the bottom is shown) and a lower polarizer 5 located beneath the substrate.

During it is used, since the substrate 1 will generate a stress, the lower polarizer 5 will deform to generate a phase difference which may result in an occurrence of light leak.

SUMMARY

According to at least one embodiments of the present application, an array substrate is provided, comprising a substrate; a pixel structural layer formed on the substrate; and a wiregrid layer located between the substrate and the pixel structural layer, the wiregrid layer comprises a plurality of light blocking bars arranged in parallel.

In an example, each of the light blocking bars in the wiregrid layer has a rectangular-shaped cross section of same size.

In an example, adjacent light blocking bars are spaced apart from each other at an equal distance.

In an example, the light blocking bars are made of reflective material.

In an example, the pixel structural layer comprises a first electrode and a second electrode, the first electrode is located between the second electrode and the substrate, the wiregrid layer is formed between the first electrode and the substrate.

In an example, the first electrode is formed on a surface of the wiregrid layer facing away from the substrate.

In an example, the first electrode is a pixel electrode and the second electrode is a common electrode; or, the first electrode is a common electrode and the second electrode is a pixel electrode.

In an example, the common electrode layer has a thickness of 117~143 nm, the light blocking bar has a thickness of 81~99 nm and a width of 67.5~82.5 nm, and two adjacent light blocking bars are spaced apart from each other at a distance of 67.5~82.5 nm.

In an example, the common electrode layer has a thickness of 130 nm, the light blocking bar has a thickness of 80 nm and a width of 75 nm, and two adjacent light blocking bars are spaced apart from each other at a distance of 75 nm.

According to at least one embodiments of the present application, a display device is further provided, comprising any of the above array substrates.

BRIEF DESCRIPTION OF THE DRAWINGS

Embodiments of the present invention will be described in more detail below with reference to the accompanying drawings to enable those skilled in the art to understand the present invention more clearly, wherein:

FIG. 1 is a structural schematic diagram of an array substrate according to conventional technology;

FIG. 2 is a structural schematic diagram of an array substrate according to an embodiment of the present application;

FIG. 3 is a partially enlarged view of the array substrate as shown in FIG. 2;

FIG. 4 is a simulated diagram illustrating trasmissivity or reflectivity of respective polarized light passing through the array substrate as shown in FIG. 2;

FIG. 5 is a schematic diagram illustrating the light passing through the array substrate as shown in FIG. 2.

DETAILED DESCRIPTION

In order to make objects, technical solutions and advantages of the embodiments of the invention apparent, technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

The specific implementations of the present invention will be described in detail. To make the description clearer, some features, or structures are omitted, but it does not mean that embodiments of the present invention only include the described features and structures, it also can include other features and structures as need.

An array substrate according to an embodiment of the present application is shown in FIG. 2, comprising a substrate 1 and a pixel structural layer formed on the substrate 1. The substrate in this embodiment further comprises a wiregrid layer 6 which is located between the substrate 1 and the pixel structural layer and is formed by a plurality of light blocking bars 4 arranged in parallel. Such a design can avoid an occurrence of light leak due to a stress generated from the substrate.

In an embodiment of the present application, each of the light blocking bars 4 in the wiregrid layer has a rectangular-shaped cross section of same size. Adjacent light blocking bars 4 are spaced apart from each other at an equal distance.

The present application is not limited thereto, for example, the light blocking bar 4 may have a semicircle-shaped cross section, or the like.

To improve the brightness, the light blocking bar 4 is made of reflective material, such as metal Al or Al alloy. In this way, the light that has not been transmitted can be reflected into a backlight source and then reflected into the array substrate by the backlight source. The reflective material can be other materials, such as resin material mixed with glass beads.

In an array substrate according to an embodiment of the present application, a pixel structural layer comprises a first electrode and a second electrode. The first electrode is located between the second electrode and the substrate, a wiregrid layer is formed between the first electrode and the substrate. To facilitate the manufacture, the first electrode can be formed on a surface of the wiregrid layer facing away from the substrate. The first electrode is a pixel electrode and the second electrode is a common electrode; or, the first electrode is a common electrode and the second electrode is a pixel electrode.

For example, in a case where the pixel electrode is located beneath the common electrode in an ADS mode, the wiregrid layer can be formed along with the source electrode and the drain electrode, thereafter the first electrode (e.g., pixel electrode) connected to the drain electrode is formed to cover the surface of the wiregrid layer. For another example, in a case where the common electrode is located beneath the pixel electrode in a ADS mode, the wiregrid layer can be formed along with the gate electrode and the common electrode lines, thereafter the common electrode is formed on the surface of the wiregrid layer. The present application is not limited to the ADS mode.

Figure 2:
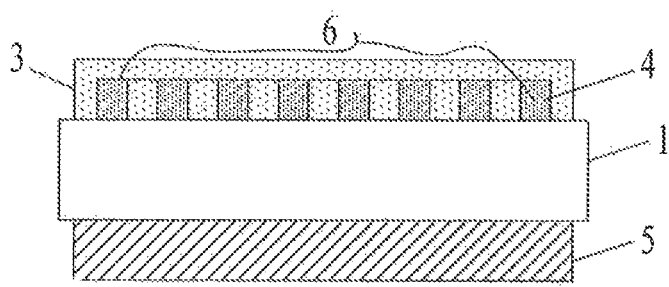

As shown in FIG. 2, a common electrode layer 3 is located at the bottom of the pixel structural layer. The wiregrid layer 6 is formed on the surface of the substrate 1, and the common electrode layer 3 is formed on a surface of the wiregrid layer 6 facing away from the substrate 1. The common electrode layer can also be located at other appropriate positions.

Figure 3:
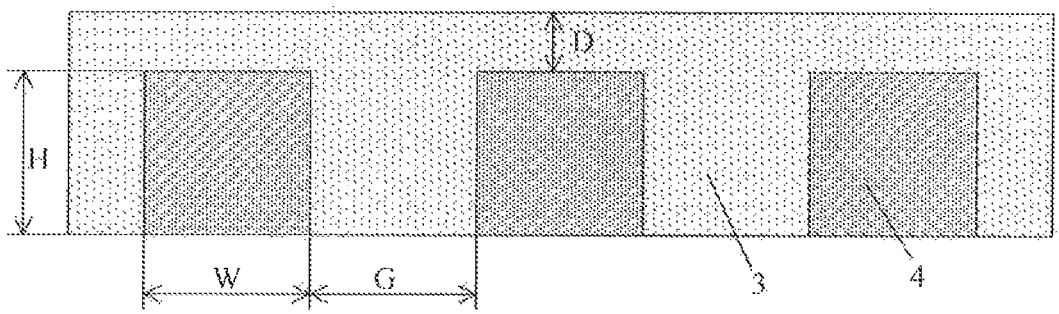

As shown in FIG. 3, the common electrode layer in the present embodiment has a thickness (H+D) of 117~143 nm, for example, 130 nm; the light blocking bar has a thickness H of 81~99 nm, for example, 90 nm, and a width W of 67.5~82.5 nm, for example, 75 nm; two adjacent light blocking bars are spaced apart from each other at a distance G of 67.5~82.5 nm, for example, 75 nm.

Figure 4:
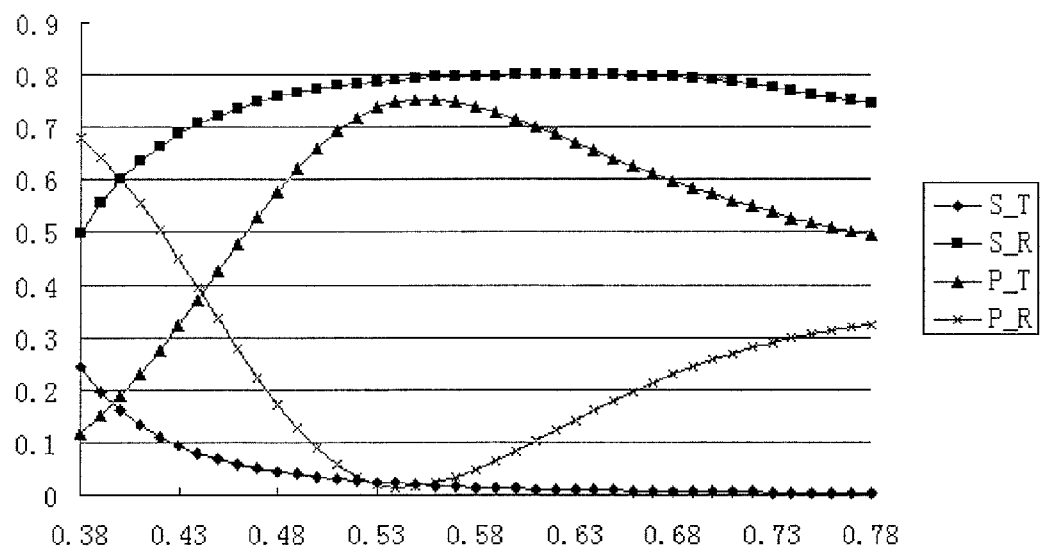
Figure 5:
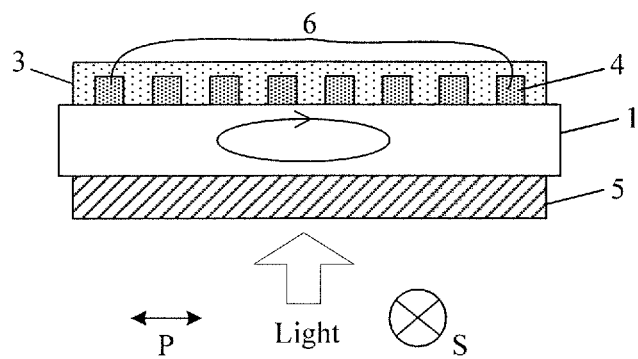

FIG. 4 illustrates results of a Rigorous Coupled Wave Analysis (RCWA) for transmissivity and reflectivity of respective polarized light in the new structure. In FIG. 4, X-axis represents a wavelength $\lambda$ while Y-axis represents a transmissivity T or a reflectivity R. The results shown in FIG. 4 are obtained under conditions that the light blocking bars 4 are arranged at a space period set as 150 nm, with each light blocking bar having a width set as 75 nm and a thickness set as 90 nm, and that an ITO layer located on the light blocking bars 4 has a thickness set as 40 nm. In combination with FIG. 5, it can be seen that, in the incident light from the backlight source, a S-polarized light component is absorbed while only a P-polarized light component left, under the function of a polarizer 5. However, due to the effect of residual stress of substrate 1, a portion of the P-polarized light component is converted into oval-polarized light. In the portion that has been converted into oval-polarized light, part of the P-polarized light component is converted into S-polarized light component. Furthermore, since the wiregrid layer 6 is characterized by allowing only the P-polarized light in one direction to pass there-through while reflecting other polarized light, for example, as shown in FIG. 4, only the P-polarized light component can pass through the wiregrid structure formed by metal or dielectric medium materials and located between the common electrode 3 and the substrate 1 but the S-polarized light component can not be transmitted, an occurrence of light leak can be avoided. In FIG. 4, a symbol S_T represents a transmissivity of the S-polarized light, a symbol S_R represents a reflectivity of the S-polarized light, a symbol P_T represents a transmissivity of the P-polarized light, and a symbol P_R represents a reflectivity of the P-polarized light.

The array substrate according to embodiments of the present invention is formed with a wiregrid layer between the substrate and the pixel structural layer, thus an occurrence of light leak resulted by a stress generated from the substrate can be avoided. Furthermore, the manufacture process thereof is quite simple.

Embodiments of the present invention further provide a display device comprising the above-mentioned array substrate. The display device can be any products or components having display functions, such as LC panel, mobile phone, tablet computer, TV, display, laptop, digital photo frame and navigator.

It is understood that the described above are just exemplary implementations and embodiments to explain the principle of the present invention and the invention is not intended to be limited thereto. An ordinary skill in the art can make various variations and modifications without departure from the spirit and the scope of the present invention, and such variations and modifications shall fall within the scope of the present invention.

The present application claims the priority of Chinese patent application No. 201310752975.5 filed on Dec. 31, 2013, titled "ARRAY SUBSTRATE AND DISPLAY DEVICE", the entire contents of which are incorporated herein by reference.

What is claimed is:

1. An array substrate, comprising
a substrate;
a pixel structural layer formed on the substrate; and
a wiregrid layer located between the substrate and the pixel structural layer and formed by a plurality of light blocking bars arranged in parallel;
wherein the pixel structural layer includes a first electrode and a second electrode, the first electrode is located between the second electrode and the substrate, and the wiregrid layer is formed between the first electrode and the substrate;
wherein the wiregrid layer is formed along with a source electrode and a drain electrode; or the wiregrid layer is formed along with gate electrode and common electrode lines.

2. The array substrate of claim 1, wherein each of the light blocking bars in the wiregrid layer has a rectangular-shaped cross section of a same size.

3. The array substrate of claim 1, wherein adjacent light blocking bars are spaced apart from each other at an equal distance.

4. The array substrate of claim 1, wherein the light blocking bars are made of reflective material.

5. The array substrate of claim 1, wherein the first electrode is formed on a surface of the wiregrid layer facing away from the substrate.

6. The array substrate of claim 1, wherein the first electrode is a pixel electrode and the second electrode is a common electrode; or, the first electrode is a common electrode and the second electrode is a pixel electrode.

7. An array substrate, comprising
a substrate;
a pixel structural layer formed on the substrate; and
a wiregrid layer located between the substrate and the pixel structural layer and formed by a plurality of light blocking bars arranged in parallel;
wherein the pixel structural layer includes a first electrode and a second electrode, the first electrode is located between the second electrode and the substrate, and the wiregrid layer is formed between the first electrode and the substrate;
wherein the wiregrid layer is formed along with a source electrode and a drain electrode; or the wiregrid layer is formed along with gate electrode and common electrode lines, the common electrode has a thickness of 117~143 nm, the light blocking bar has a thickness of 81~99 nm and a width of 67.5~82.5 nm, and two adjacent light blocking bars are spaced apart from each other at a distance of 67.5~82.5 nm.

8. An array substrate, comprising
a substrate;
a pixel structural layer formed on the substrate; and
a wiregrid layer located between the substrate and the pixel structural layer and formed by a plurality of light blocking bars arranged in parallel;
wherein the pixel structural layer includes a first electrode and a second electrode, the first electrode is located between the second electrode and the substrate, and the wiregrid layer is formed between the first electrode and the substrate;
wherein the wiregrid layer is formed along with a source electrode and a drain electrode; or the wiregrid layer is formed along with gate electrode and common electrode lines, the common electrode has a thickness of 130 nm, the light blocking bar has a thickness of 90 nm and a width of 75 nm, and two adjacent light blocking bars are spaced apart from each other at a distance of 75 nm.

9. A display device, comprising the array substrate of claim 1.

10. The array substrate of claim 2, wherein adjacent light blocking bars are spaced apart from each other at an equal distance.

11. The array substrate of claim 2, wherein the light blocking bars are made of reflective material.

12. The array substrate of claim 3, wherein the light blocking bars are made of reflective material.

13. The array substrate of claim 7, wherein each of the light blocking bars in the wiregrid layer has a rectangular-shaped cross section of a same size.

14. The array substrate of claim 7, wherein adjacent light blocking bars are spaced apart from each other at an equal distance.

15. The array substrate of claim 7, wherein the light blocking bars are made of reflective material.

16. The array substrate of claim 7, wherein the first electrode is formed on a surface of the wiregrid layer facing away from the substrate.

17. The array substrate of claim 7, wherein the first electrode is a pixel electrode and the second electrode is a common electrode; or, the first electrode is a common electrode and the second electrode is a pixel electrode.

* * * * *